455-612 AU 233 EX

FIP8106 XR 3,143,655

[redacted]

(2)

PHOTOSENSITIVE SWITCHING DEVICE IN A WAVEGUIDE

Filed Jan. 25, 1960

W.G. operating below cut off of electrical signal frequency

INVENTOR.
MALCOLM W. P. STRANDBERG
BY
Joseph Weingarten
ATTORNEY

3,143,655
PHOTOSENSITIVE SWITCHING DEVICE IN A WAVEGUIDE

Malcolm W. P. Strandberg, Prospect St., Box 201, Marshfield Hills, Mass.

Filed Jan. 25, 1960, Ser. No. 4,241
5 Claims. (Cl. 250—239)

This invention relates in general to switching and control apparatus, and more particularly, to a reliable, compact and relatively inexpensive photoconductive modulator providing a controllable resistance characteristic having extensive utility in the electrical and electronic arts.

Electrical switching devices capable of change from a very high resistance to a very low resistance in response to an actuating signal, are of course well known in the electrical art. In its simplest form, a switch may comprise an electrically conducting linkage wherein a pair of contacts are opened or closed in response to mechanical movement. The vast growth of the electrical and electronic arts has correspondingly generated requirements for a large variety of such switches having a diversity of requirements as, for example, life, dependability, speed of response and value of maximum and minimum resistance. The exact nature of the parameters specified depend upon the particular application involved, and to meet the needs of industry and science, many switching devices have been devised, such as vacuum tube and transistor devices, relays, vibrating reeds, and the like. A control problem which imposes perhaps more stringent requirements on the switching element is presented when it is desired to modulate or "chop" a low level D.C. signal voltage in order that it may be amplified in an A.C.-coupled amplifier. This is generally desirable since A.C.-coupled amplifiers are inherently of greater stability and gain than a D.C.-coupled system.

In such chopper-stabilized amplifiers, a D.C. potential is applied through the switching device to the input of an A.C. amplifier. The switching device is then actuated or modulated by some external excitation to repetitively switch between low and high resistance (preferably between true open and short circuits), thereby providing an alternating current signal, characteristic of the direct signal, at the input terminals of the amplifier. The output of such an amplifier may be utilized directly as an amplified A.C. signal, or by means of a synchronous and similar switching device, operated whereby a D.C. output signal is derived, amplified by the A.C. amplification factor of the amplifier.

To achieve optimum performance, a rapidly changing smooth, square-wave characteristic of resistance having lower and higher values of resistance of substantially zero and infinity, respectively, is desirable. Devices dependent essentially on mechanically switched contacts, such as relays, vibrating reeds, etc., are subject to the problem of making intermittent contact just before or just after their change of state due to factors such as contact bounce, and thus a ragged, relatively unstable resistance characteristic at the beginning and end of each cycle is derived. A further limitation is relatively low operating speed, since a mechanical spring tension must be overcome in order for the switch to change from one condition to the other. Other disadvantages of switches of this type are their mechanical complexity which necessarily increases cost, a useful life which is limited by the fatigue and wear characteristics of the mechanical components and sensitivity to variations in atmospheric conditions, such as changes in humidity, temperature, dust, and the like.

Electronic systems, such as vacuum tubes and transistors, are apt to provide an undesirably high noise current, thereby limiting sensitivity, but in addition, require specialized auxiliary stable external power supplies.

A development of comparatively recent origin has been the introduction of the photoconductive element to the modulator art. A photoconductive cell, as is well known, has a normally high resistance which is reduced to a significantly low value in response to light energy incident on its sensitive surface. By using a luminous source, such as a lamp and by modulating the supply current thereto, the resistance of the photoconductive cell may be similarly modulated. A D.C. voltage applied to the cell, through a simple resistor may thus be modulated by this change in photoconductor resistance to yield an A.C. waveform. In order to obtain minimum speed with a square waveform, the lamp is preferably of the gas discharge type which has the characteristic of providing substantially uniform light output in the ON condition, no light in the OFF condition, while switching from ON to OFF may be achieved at high speed without passing through wide ranges of low luminous intensity.

There are some serious disadvantages which are encountered in the use of modulating device of this character. Perhaps the most significant disadvantage arises from the need to place the light source in close proximity to the photoconductive cell to maximize the utility of the luminous flux. In one such prior arrangement, the discharge lamp is physically wrapped around the photoconductor, and while this arrangement enhances the light coupling, the electric fields generated by currents actuating the lamp are radiatively coupled to and picked up by the photo conductor element, thus appearing in the output. This represents a serious problem, since this signal output is generated even in the absence of an applied D.C. signal potential to the photoconductive cell, thereby producing an overriding, undesirable fixed "noise" level. With high level inputs, this noise effect may be of lesser importance; however, with low level, sensitive D.C. amplifiers, the utility is clearly limited.

Another factor which must be considered is that many photoconductors are also photoelectrically emissive, that is, the impingent light gives rise to a generated current in the photoconductor itself. Since this photoelectric current will appear an an input to the D.C. amplifier, this too, effectively represents a noise signal which limits the effectiveness of the device as a switch.

It is therefore a primary object of this invention to provide an efficient, compact, photoconductor modulating switch of broad application having a resistance characteristic which may be varied rapidly and precisely as a function of time with a minimum of inherent noise.

It is another object of this invention to provide a low cost, reliable photoconductor switching device which may be controlled to undergo a rapid and wide change of resistance at relatively high frequencies with minimum power consumption and without the need for specialized, costly power sources.

It is still another object of this invention to provide a photoconductive switching device employing a discharge lamp and a photoconductive cell, in which the luminous energy from the lamp is efficiently coupled to the photoconductor substantially without electric field radiation coupling between light source and photoconductor.

It is a further object of this invention to provide a compact device utilizing a single commercially available, inexpensive light source which furnishes two separate and distinct photoconductive switches of substantially identical characteristic, and which under normal energization, provide two oppositely phased switching functions.

Broadly speaking, the present invention comprises a photoconductive switch which employs a discharge lamp and a photoconductive cell substantially separated from one another with the luminous flux from the lamp coupled through an intermediate, simplified optical system to the sensitive surface of the photoconductive cell. Modulated light reaching the photoconductor surface through the optical system results in corresponding resistance modulation, while the electric field radiated from the lamp is attenuated to be substantially without effect upon the photoconductor by virtue of the physical separation.

A further improvement is obtained by enclosing the lamp, the optical system and the photoconductor cell within an electrically conductive light-tight tube, the spacing between lamp and photoconductive cell being such with respect to the cross-section of the enclosure, whereby the conductive enclosure serves as a waveguide operating beyond the cutoff. The electric field radiation from the lamp is thus markedly attenuated while the efficient optical coupling provides maximum light intensity on the surface of the photoconductor. Maximum resistance variation is thereby achieved during modulation of the light output from the OFF to the ON position, with an absolute minimum of induced noise.

These and other objects and advantages will become apparent from the following detailed description when taken in conjunction with the accompanying drawing in which.

Figure 1:
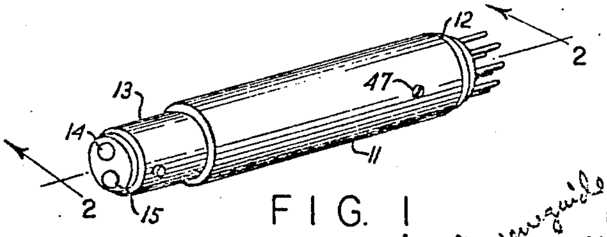
FIG. 1 is a perspective, external view of the apparatus of this invention.

With reference now to the drawing and more particularly to FIG. 1 thereof, an external perspective of the photoconductor switch of this invention is shown. An elongated, conductive light tight cylinder 11 of, for example, brass, is terminated at one end by a multiple-pin electrical connector 12, preferably of opaque plastic, and at the opposite end by a lamp having a base 13 and two electrical terminals 14 and 15.

Figure 2:
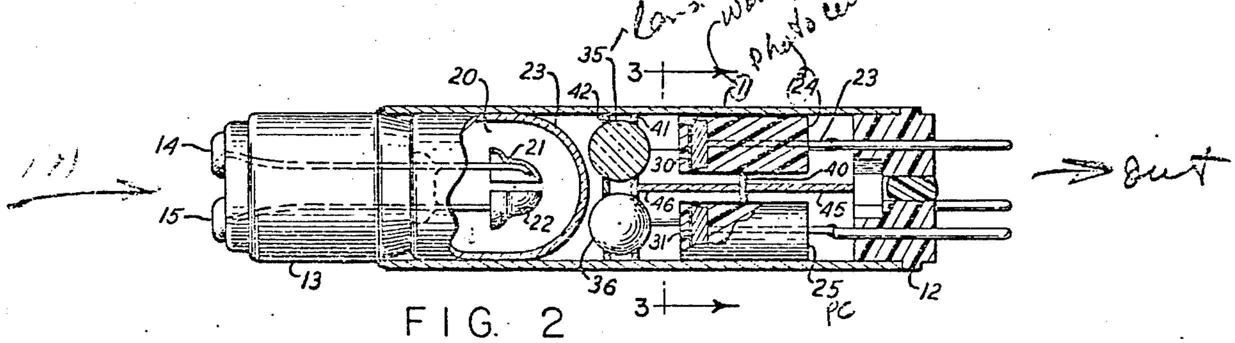
FIG. 2 is a side view, partly in cross-section, the cross-sectional portion being taken along the line 2—2 of FIG. 1; of the apparatus of this invention.
Figures 3, 4:
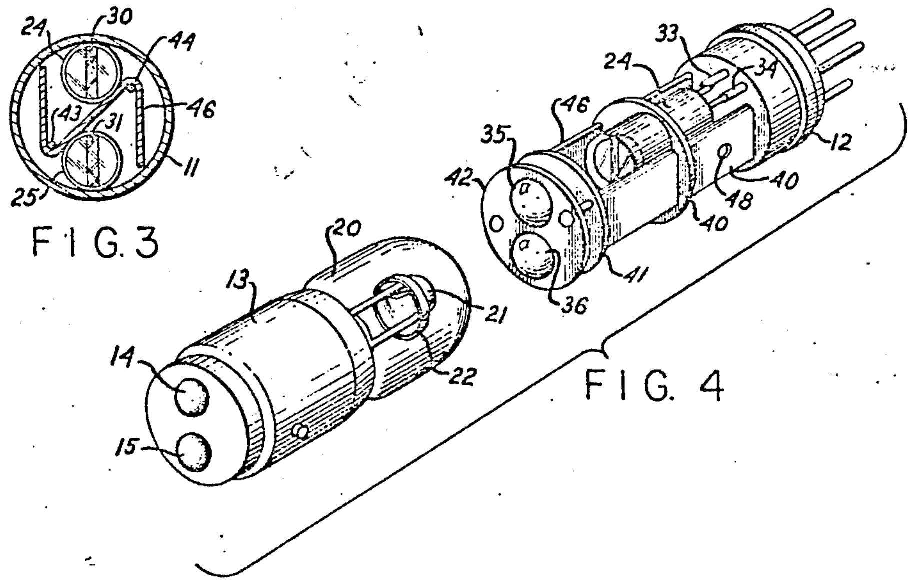
FIG. 3 is a cross-sectional view of the apparatus of this invention taken along the line 3—3 of FIG. 2.
FIG. 4 is a perspective view illustrating the detail and physical spacing of the internal elements of this apparatus with the outer enclosure removed for clarity.

With reference now specifically to FIGS. 2, 3, and 4, the internal construction of the photoconductor switch of FIG. 1 is shown in detail. A conventional, commercially available, neon glow discharge bulb 20, extends into, and has its base 13 conductively affixed to cylinder 11. Discharge bulb 20 has two electrodes 21 and 22 enclosed in the glass envelope 23, the latter being wholly within cylinder 11, so that no light may emanate externally at that end. One of the lamp electrodes is shown connected to terminal 14, while the other is connected to terminal 15. A current supply (not shown) such as the available 60 cycle 110 volt A.C. may be connected to terminals 14 and 15 to supply power for the discharge lamp.

A pair of photoconductor cells 24 and 25 are disposed within housing 11 at the end opposite the discharge lamp 20 and directly coupled to appropriate pins of electrical connector 12. Each of the photoconductor cells 24 and 25 is comprised of a plastic cylinder formed of a material transparent to light and each includes an imbedded strip of photoconductive material, these being designated 30 and 31, respectively. A pair of wires 33 and 34, as is best illustrated in FIG. 4, directly connect photoconductive strip 30 to the respective connector pins, and a similar pair of wires, one of which is visible in FIG. 2, couples photoconductor strip 31 to its connector pins.

Cadmium selenide, which is commercially available, has been found to be a useful material for the photoconductive strips 30 and 31. The front surface of each of the photoconductive strips is slightly recessed from and located in a plane parallel with the surface of the respective plastic cylinder facing the discharge lamp 20. This flat end surface of the plastic cylinder is transparent and thus permits the passage of light from the discharge lamp to the surface of the photoconductive strips 30 and 31. The remainder of the outer surface of each of the photoconductor cell plastic enclosures is coated with a light-tight coating, such as black opaque paint thereby preventing light from entering from any direction but the surface facing the discharge lamp.

A pair of spherical lenses 35 and 36, which may consist of glass or plastic beads, or the like, are mounted intermediate the discharge lamp 20 and the pair of photoconductor cells 24 and 25. The respective components are angularly oriented as shown, so that spherical lens 35 focuses light from the immediate vicinity of electrode 21 within discharge lamp 20 on the photoconductive surface of cell 24, while lens 36 focuses light from the immediate vicinity of electrode 22 in discharge lamp 20 upon the photoconductive surface of cell 25.

As is best illustrated in the cross-sectional view of FIG. 3 and in the perspective view, FIG. 4, of the internal structure of the photoconductive switch, photoconductor cells 30 and 31 and lenses 35 and 36 are retained in position by means of three circular discs 40, 41, and 42, disposed in planes at right angles to the longitudinal axis of cylinder 11. The discs 40, 41, and 42 are in turn supported upon axial rods 43 and 44, which are formed as extensions of pins in the connector 12. The discs may be connected to rods 43 and 44 by small solder beads, or by any other conventional, mechanical expedient.

A pair of like barrier members 45 and 46, each having a Z-shaped cross-section are interposed between photoconductor cells 24 and 25 to provide a light shield, which serves to prevent light impinging in one cell being transmited by reflection, or otherwise, to the other. Barrier members 45 and 46 are disposed in opposite sides of disc 40, and extend from the inner face of connector 12 to disc 41. These members may be formed of any light opaque material, but a metallic material such as brass is preferred, since this allows mechanical connection to discs 40 and 41 and to rods 43 and 44 by soldering. The Z-shaped member 45 is formed with a small threaded hole 48 on one side, adapted to accept a small screw 47 (FIG. 1), which serves as a firm electrical connection coupling metal cylinder 11 to the internal conductive partitions. With screw 47 in place, an extremely rigid structure is attained.

All of the internal surfaces, with the exception of glass envelope 23 of the discharge lamp 20, spherical lenses 35 and 36 and the plastic surface on the inner end faces of photoconductor cells 24 and 25 are coated with black paint to minimize light reflections within the structure. By virtue of the manner in which cylinder 11 is connected to the connector 12, as shown in FIG. 2, and also by virtue of the sealed conneciton between cylinder and discharge lamp base, ambient external illumination is wholly without effect.

Having described the physical nature of photoconductive modulation switch, its operation will now be discussed. As previously indicated, each photoconductive cell has the characteristics of presenting a resistance between its terminals which is dependent upon the amount of light incident on their sensitive surfaces. Thus, the resistance when measured across the terminals of photoconductor cell 24, namely wires 33 and 34, will be at a maximum value when there is no light from the lamp 20 falling upon sensitive element 30. This resistance will drop to a minimum value when a predetermined light illuminates the sensitive surface. If a source of electric current, for example, the 60 cycle 110 volt A.C. line is applied to contacts 14 and 15 of discharge lamp 20, the lamp will glow and produce visible light. However, due to its particular nature the glow producing the luminous energy will be confined to regions immediately surrounding opposite electrodes on alternate half cycles. Thus, on one half cycle of the alternating current, electrode 21 will glow, while on the other half cycle, electrode 22 will glow. Since the optical system is arranged to provide focusing of the light from each electrode on respective photoconductive cells, one cell will be in a state of high resistance while the other is in the state of low resistance, and this condition will change every half cycle. It is a further characteristic of a discharge lamp, such as the neon bulb shown, that it has essentially two states, one being the ON and the other being the OFF condition. In the OFF condition no light is generated and in the ON condition, immediately subsequent to ignition, a maximum amount of light is developed which remains substantially constant until the lamp is extinguished.

Cadmium selenide is a particularly desirable photoconductive material for the sensitive elements 30 and 31, particularly because of the low photoelectric effect. In other words, the incident illumination results solely in a change in resistance and does not have the effect of generating any photoelectric currents which would represent noise in the system to which the modulator is coupled. Typically, a cadmium selenide photo-conductive strip, such as shown in the drawings, presents a 10 megohm resistance in the absence of light. Intense light will reduce this resistance to a value of the order of 50,000 ohms. Cells are obtainable in which the resistance range may be controlled between megohms and values as low as 3,000 ohms under the action of light. The spherical lenses 35 and 36, which are particularly economical, and which, further, may be readily installed as shown in FIGS. 2 and 4, are characterized by various aberrations. However, for the apparatus shown, these aberrations do not impair the operation because the discharge bulb electrodes 21 and 22 and the surfaces 30 and 31 of the sensitive elements are relatively large. Thus, it is not necessary to employ optical elements with a small circle of confusion. It is sufficient to note that the optical system shown in the drawing properly directs light from each glow lamp electrode to the respective photoconductor without "cross-talk."

As previously observed, a glow lamp, such as neon bulb 20, characteristically radiates electric fields which if impinged upon the sensitive elements 30 and 31, or their respective coupling wires, will result in output noise signals. A feature of the present invention is that a substantial separation is maintained between the source of luminous energy and the photoconductive element. This separation alone sharply reduces the effect of radiated electric fields. The light flux is not seriously diminished by virtue of the separation, due to the optical system illustrated. In addition, the electric field coupling between the light source and the photoconductive elements is further reduced in the apparatus shown by the axial arrangement of the components within conductive cylinder 11. In effect, the conductive cylinder 11 is a waveguide operating beyond cutoff, which together with the partitioning discs 40, 41 and 42 and the Z-shaped barriers, result in a large attenuation in the transmission path for such radiations between bulb and photoconductor elements. Since the length of cylinder 11 is several times greater than its diameter, an attenuation of these undesired fields in the order of 160 db may be achieved.

With an alternating current impressed upon terminals 14 and 15 of the glow lamp, the resistance characteristic of each of the sensitive elements 30 and 31 will be essentially a square wave in shape. These waveforms will be substantially 180 degrees out of phase. These resistance characteristics may be used independently in different circuits, or they may be combined for use in a single application. Typically, a signal to be amplified may be applied to the input terminals of an amplifier through a relatively high series resistance. By connecting one of the photoconductive elements directly across the input terminals of the amplifier through the appropriate pins in connector 12, and actuating bulb 20 with an alternating current, the change in resistance from maximum to minimum will chop the signal input to the amplifier. Chopper action may be enhanced, however, by connecting the other sensitive element so that it serves as the series resistance previously mentioned. In essence, then, the series resistance will be a maximum when the shunt resistance is a minimum and vice versa.

The use of synchronous choppers is well known as a means of obtaining D.C. amplification with an alternating current amplifier. For this purpose, one of the photoconductive elements may be used as a switch in the input to the amplifier, while the other is used in the amplifier output. A device, such as shown in the drawing, will provide the necessary synchronous and oppositely phased switching characteristics.

Another feature of this invention, which should now be apparent, is the relatively long life which is available. Glow tubes, such as neon bulb 20, inherently are capable of operating for long periods of time and this is likewise true for the photoconductive sensitive elements. There are no moving parts to wear, no contacts to burn, or to corrode or accumulate dust so that life is only dependent upon the parameters of well-known stable, electrical devices. Further, since the glow tube 20 is not a synchronous mechanical device, satisfactory operation may be achieved over a broad range of frequencies simply by varying the frequency of the alternating current applied at terminals 14 and 15. A sinusoid may be used or the waveform may, if such signals are available, be rectangular, or the like.

In view of the foregoing, it is evident that the present invention provides a useful means for obtaining effective switching with a minimum of cost. Although the discussion above has been largely limited to the utility of this device as a chopper for D.C. amplifiers, application may be made wherever resistance variation of this nature is required.

In view of the fact, therefore, that numerous modifications and departures may now be made by those skilled in this art, the invention herein is to be construed as limited only by the spirit and scope of the appended claims.

What is claimed is:

1. Electrical switching apparatus comprising, in combination, an electrically actuated device having a plurality of luminous sources, a like plurality of photoconductive elements spaced from said luminous sources, and optical means for concentrating luminous energy from each of said sources upon a respective one of said photoconductive elements, and a light-tight electrically conductive waveguide beyond cutoff for substantially attenuating electric field radiations from said luminous sources in the transmission path to said photoconductive elements at frequencies below the cutoff frequency of said waveguide, said waveguide enclosing said luminous sources, said optical means and said photoconductive elements.

2. Electrical switching apparatus comprising, an elongate electrically conductive opaque cylinder, a connector having electrical terminals extending therethrough providing a light-tight seal at one end of said cylinder, a glow discharge tube having a pair of spaced electrodes and a base, said glow discharge tube being arranged whereby said electrodes extend within the opposite end of said cylinder and said base extends outwardly thereof and provides a light-tight seal thereat, a pair of photoconductive elements adjacently disposed within said cylinder in the region of said connector and respectively coupled to said electrical terminals, each of said photoconductive elements having a sensitive surface aligned with and confronting a respective one of said electrodes, means partitioning said cylinder in the region intermediate said electrodes and said sensitive surfaces and a pair of lenses disposed in said partitioning means and each being aligned with a respective electrode and sensitive surface combination, each of said lenses being arranged to substantially focus light emitted in the region of the respective electrode upon the respective sensitive surface, said cylinder having an axial length between said ends substantially greater than the cross-sectional diameter thereof and thereby functioning as a waveguide beyond cutoff for substantially attenuating electric field radiations in the transmission path between said glow discharge tube and said photoconductive elements.

3. Electrical switching apparatus in accordance with claim 2 and including an opaque conductive barrier between said photoconductor elements and extending between said partitioning means and said connector.

4. Electrical switching apparatus in accordance with claim 2 wherein said partitioning means is formed of conductive discs disposed transversely of the longitudinal axis of said cylinder.

5. Electrical switching apparatus in accordance with claim 3 wherein said lenses are spherical having opposite foci substantially on said respective electrode and said respective sensitive surface.

References Cited in the file of this patent

UNITED STATES PATENTS

| | | |
|---|---|---|
| 2,065,421 | Bernarde | Dec. 22, 1936 |
| 2,302,874 | Lion | Nov. 24, 1942 |
| 2,493,919 | Holmes | Jan. 10, 1950 |
| 2,666,148 | Arvintz et al. | Jan. 12, 1954 |
| 2,764,149 | Sheldon | Sept. 25, 1956 |
| 2,815,487 | Kaufman | Dec. 3, 1957 |
| 2,839,616 | MacMillan | June 17, 1958 |
| 2,901,700 | Bolie | Aug. 25, 1959 |
| 2,928,937 | Harman | Mar. 15, 1960 |
| 2,953,689 | Becker | Sept. 20, 1960 |
| 2,967,279 | Beck | Jan. 3, 1961 |
| 2,967,945 | De Gier | Jan. 10, 1961 |
| 2,997,596 | Vize | Aug. 22, 1961 |
| 3,059,116 | Robertson | Oct. 16, 1962 |